(12) United States Patent
Bianchi

(10) Patent No.: US 11,018,647 B2
(45) Date of Patent: May 25, 2021

(54) ELECTRICAL FILTER STRUCTURE

(71) Applicant: Advantest Corporation, Tokyo (JP)

(72) Inventor: Giovanni Bianchi, Ehningen (DE)

(73) Assignee: Advantest Corporation, Tokyo (JP)

( * ) Notice: Subject to any disclaimer, the term of this patent is extended or adjusted under 35 U.S.C. 154(b) by 0 days.

(21) Appl. No.: 16/849,671

(22) Filed: Apr. 15, 2020

(65) Prior Publication Data

US 2021/0044268 A1 Feb. 11, 2021

Related U.S. Application Data

(63) Continuation of application No. PCT/EP2019/071081, filed on Aug. 6, 2019.

(51) Int. Cl.
*H03H 7/01* (2006.01)
*H04B 3/21* (2006.01)
*H03H 7/12* (2006.01)

(52) U.S. Cl.
CPC ........ *H03H 7/0138* (2013.01); *H03H 7/0161* (2013.01); *H03H 7/12* (2013.01); *H04B 3/21* (2013.01)

(58) Field of Classification Search
CPC .............................. H03H 7/01; H03H 7/0138
USPC .................................................. 333/175, 176
See application file for complete search history.

(56) References Cited

U.S. PATENT DOCUMENTS

| | | | |
|---|---|---|---|
| 5,059,889 A | 10/1991 | Heaton | |
| 5,579,236 A | 11/1996 | Tamamura et al. | |
| 5,615,380 A | 3/1997 | Hyatt | |
| 6,885,700 B1 | 4/2005 | Kim et al. | |
| 8,706,062 B1 | 4/2014 | Yu et al. | |
| 9,203,371 B2* | 12/2015 | Bianchi | H03H 7/0138 |
| 9,209,772 B2* | 12/2015 | Bianchi | H03H 7/0123 |
| 2003/0058148 A1 | 3/2003 | Sheen | |
| 2005/0104597 A1 | 5/2005 | Klijn et al. | |
| 2005/0172181 A1 | 8/2005 | Huliehel | |
| 2009/0121908 A1 | 5/2009 | Regier | |
| 2010/0176815 A1 | 7/2010 | Roth | |
| 2011/0109300 A1 | 5/2011 | Vulovic et al. | |
| 2011/0227767 A1 | 9/2011 | O'Brien | |
| 2012/0306517 A1 | 12/2012 | Regier et al. | |
| 2014/0009129 A1 | 1/2014 | Shimizu et al. | |
| 2014/0195870 A1 | 7/2014 | Ma | |

* cited by examiner

*Primary Examiner* — Hai L Nguyen

(57) ABSTRACT

An electrical filter structure for forwarding an electrical signal from a first port to a second port in a frequency selective manner, wherein the filter is an edge-coupled filter, the filter comprising: a plurality of coupled line sections coupled in a series, comprising at least a first coupled line section and a last coupled line section; wherein the first port is connected with the first of the coupled line sections using a first transmission line; wherein the second port is connected with the last of the coupled line sections using a second transmission line; wherein the electrical filter comprises an open stub; wherein a length of the open stub is chosen such that an electrical length of the open stub is equal, within a tolerance of +/−20 percent, to a fourth of a wavelength of a signal having a frequency of twice a passband center frequency of the filter.

20 Claims, 14 Drawing Sheets

|  | conventional | tapped (old) | tapped (new) |
|---|---|---|---|
| realizable $\Delta f/f_0$ | < 15% | < 38% | < 38% |
| maximum stop-band attenuation for $f < 2f_0$ | ~30 dB | > 60 dB | ~41 dB / > 60 dB |
| minimum stop-band attenuation for $f < 2f_0$ | ~2 dB | ~1 dB | ~16 dB / ~47 dB |
Fig. 4
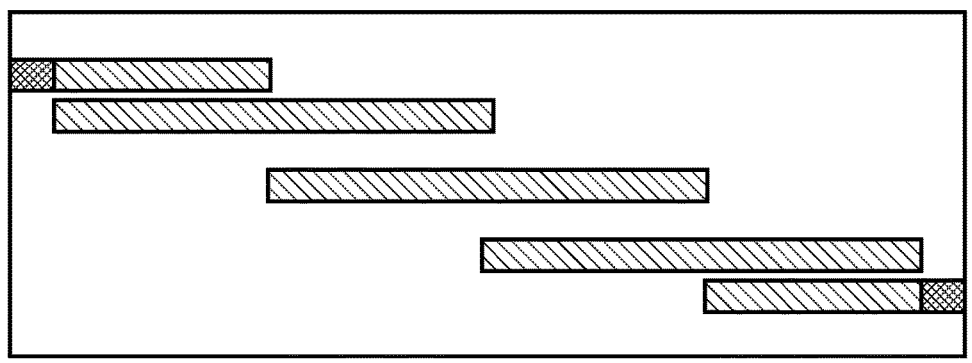
Fig. 5 (a)
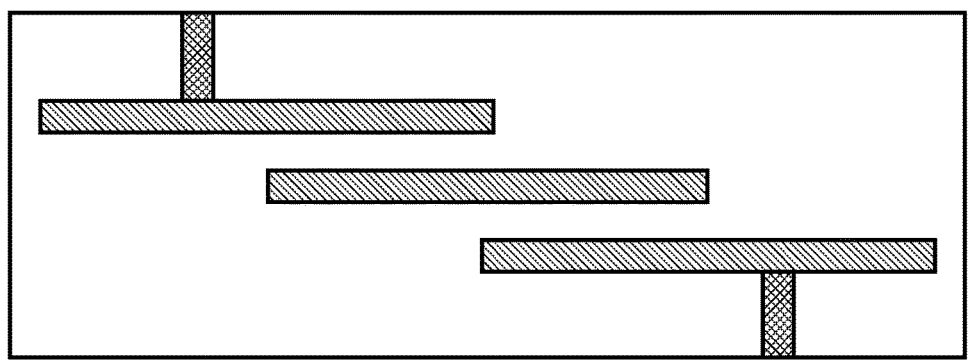
Fig. 5 (b)

ELECTRICAL FILTER STRUCTURE

CROSS-REFERENCES TO RELATED APPLICATIONS

This application is a continuation of co-pending International Application No. PCT/EP2019/071081, filed Aug. 6, 2019, which is incorporated herein by reference in its entirety.

DESCRIPTION

Technical Field

Embodiments according to the invention are related to an electrical filter structure for forwarding an electrical signal from a first filter port to a second filter port in a frequency-selective manner. Some embodiments according to the invention are related to an edged-coupled filter.

Background of the Invention

Electrical filter structures are used in many applications. For example, electrical filter structures may be implemented to act as a low-pass filter, as a bandpass filter or as a high-pass filter. In the following, a brief introduction will be given to the design of filters.

The Edge-Coupled Filter (ECF, sometimes also referred as "parallel-coupled filter") is a classical microwave filter structure. In the following, the working principle and the design procedure are described using figures. FIG. 8 shows a schematic electric principle diagram of an example of the ECF as an equivalent circuit with N+1=4. In addition, FIG. 9 shows a schematic illustration of an example of a layout of a possible printed-circuit realization.

The ECF consists of N+1 (N is the order of the filter) cascaded Coupled-Lines Sections (CLS), each being $\lambda/4$ long at the centre frequency of the filter ($f_0$). Equivalently, the filter can be seen as N $\lambda/2$ resonators (from OPEN to OPEN) coupled to each other and to the input/output (P1, P2) by $\lambda/4$ as shown in FIGS. 8 and 9. The structure of the filter is symmetrical, in that the N+1-th coupled lines are identical to the $1^{st}$ one, the $N^{th}$ to the second one, and so on. Such filters are particularly suitable for printed realization: microstrip or stripline as shown in FIG. 9.

There are some limitations to appropriately implement the ECF, for example, one limitation of the ECF is the tight coupling needed for the first and last coupled-line sections. This prevents the realization of wide band filters, unless a modified structure is used. One possible modification consists of replacing the parallel-coupled line mechanism with a direct (or "tapped") coupling to the first and last $\lambda/2$ resonator. For example, FIG. 10 shows a schematic tapped-edge-coupled filter (TECF) 100. FIG. 11 shows an illustration of a possible microstrip layout with the open stub in-line of the TECF 100, and FIG. 12 shows another illustration of a microstrip layout with the open stub rotated by 90 degrees of the TECF 200. As shown in the FIG. 11, the TECF 100 comprises a plurality of coupled line sections (CLS) coupled in series, a first port (input port) P1 which is connected with a CLS, i.e., indicated as CLS 2, using a first transmission line 110, and a second port (output port) P2 which is connected with a CLS, i.e., indicated as CLS 3, using a second transmission line 112. The first transmission line 110 has a first open stub 120 and the second transmission line 112 has a second open stub 122. As depicted in FIG. 11, the first transmission line 110 has a length $l_{1A}$ and an impedance $Z_{0A}$ and the first open stub has length $l_{1A}$ and an impedance $Z_{0A}$. Also, the second transmission line 112 has a length $l_{1A}$ and an impedance $Z_{0A}$ and the second open stub 122 has length $l_{1A}$ and an impedance $Z_{0A}$. Normally, it is determined $Z_{0A}=Z_{0B}$, $l_{1A}+l_{1B}\approx\lambda/4$ (i.e., electrical length $l_{1A}+l_{1B}$ is nearly equal to a fourth of wavelength of a signal frequency), at a passband centre frequency $f_0$. Moreover, $Z_{0A}=Z_{0B}$ are chosen such to have the width of the coupling elements equal to the one of the adjacent CLS. The TECF 200 of FIG. 12 has a similar configuration to the TECF 100 of FIG. 11 other than the position of the open stub.

FIG. 13 shows examples of edge-coupled filter response, i.e., responses of three different ECF are shown. A line indicates a response of a conventional ideal ECF shown in FIG. 8, a dashed line indicates a response of a conventional, microstrip layout ECF shown in FIG. 9, and a double-dashed line indicates a response of a microstrip layout TECF shown in FIG. 11 or 12. These three filters have a secondary pass/band region located at $3f_0$, i.e., three times of the centre frequency.

As indicated in FIG. 13, both EGF and TECF present an unwanted spurious pass-band in the region around $2f_0$ (~20 GHz, in the example), which is not present in the ideal case. That is due to:
- the unequal propagation speeds between even and odd modes (microstrip or suspended-stripline) CLS
- the finite capacitance related with the end effect on the open-sides of the CLS (which are never ideal open circuits), which differently perturbs the even and odd mode speed (this apply to any case, microstrip, stripline, suspended stripline, machined structures, and so on)

ECF and TECF behave differently in the region $f_0\pm2f_0$. In the first case the attenuation reaches a local maximum (~30 dB, at 15 GHz in the example indicated in FIG. 13) and then becomes very small at $2f_0$. The attenuation of the TECF becomes instead very high (ideally infinite, >60 dB between 14 and 15 GHz in the example) before reaching the local minimum at $2f_0$. This improves also the selectivity of TECF in the low-pass side. The frequency of such transmission zero is the one at which the open stubs are a quarter of wavelength ($l_{1B}\approx\lambda/4$).

The maximum realizable relative bandwidth ($\Delta f/f_0$) of the ECF is determined by the minimum realizable gap as well as the substrate parameters (dielectric constant $\varepsilon_r$, and thickness h). This limitation is much stronger in ECF then in TECF, due to the fact that the first coupled-line section of ECF requires tighter coupling as the remaining one.

FIG. 13 shows illustrations of microstrip layout variations with $\varepsilon_r=9.9$, h=508 µm, radio frequency ports are indicated as a protrusion in left-right direction. That is, FIG. 14 (a) shows an ECF, minimum gap=50 µm, $\Delta f/f_0\approx0.15$, FIG. 14 (b) shows a TEGF, minimum needed gap=370 µm, the same $\Delta f/f_0$ as the ECF, and FIG. 14 (c) shows a TEGF, minimum gap=50 µm, $\Delta f/f_0\approx0.38$ (i.e. >two of the EGF with the same minimum gap).

FIG. 15 shows examples of edge-coupled filter response, i.e., a line indicates a response of filter shown in FIG. 14 (a), a dashed line indicates a response of filter shown in FIG. 14 (b) and a double-dashed line indicates a response of filter shown in FIG. 14 (c).

However, as indicated in FIG. 15, the filters shown in FIG. 14 still have an unwanted spurious pass-band in the region around 2 $f_0$ (twice a passband center frequency).

Accordingly, it is an object of the present invention to create a concept which facilitates the implementation of a desired filter characteristic using a readily available technology.

SUMMARY OF THE INVENTION

An embodiment according to the invention creates an electrical filter structure for forwarding an electrical signal from a first port to a second port in a frequency selective manner. The filter is an edge-coupled filter, ECF, and the filter comprises a plurality of coupled line sections, CLS, coupled in a series, comprising at least a first coupled line section and a last coupled line section, optionally the filter comprises even more coupled line sections. The first port, P1, is connected with the first of the coupled line sections, e.g., with a first line section of the CLS at number 2 shown in FIG. 9 or 10, using a first transmission line. The second port, P2, is connected with the last of the coupled line sections, e.g. with a second line section of the CLS at number 3 shown in FIG. 9 or 10, using a second transmission line. The electrical filter comprises an open stub, e.g., at a side of the first port, or at the fist port, or at a position of the first port, or branching from the first transmission line or branching between the first port and the first coupled line section. A length of the open stub is chosen such that an electrical length of the open stub is equal, within a tolerance of +/−20 percent, or preferably within a tolerance of +/−10 percent, to a fourth of a wavelength of a signal having a frequency of twice a passband center frequency of the filter.

It has been found that the length of open stub is chosen such to have the width of the coupling elements equal to the one of the adjacent CLS. Accordingly, it is, for example, possible to obtain a frequency of transmission zero and to reduce unwanted spurious pass-band in the region around $2f_0$. In other words, it is possible to obtain overall filter structure, which is well-adapted to the available technology and therefore often provides better characteristic than a filter structure having an open stub with a length $l \approx \lambda/4$ at a passband center frequency.

In a preferred embodiment, an impedance of the open stub is chosen such that a working impedance of the filter is matched, e.g., in the pass-band of the filter. Accordingly, it is not necessarily a further step to arrange the impedance matching and therefore, the design effort and design costs are reduced.

In a preferred embodiment, a length of the first transmission line is chosen such that a working impedance of the filter is matched, e.g., in the pass band of the filter. Accordingly, it is possible, for example, to obtain the open stub at the external part of the tapped edge-coupled filter (TECF) which provides a transmission zero at $2f_0$.

In a preferred embodiment, a width of the first transmission line is the same width of a line section of the first of the coupled line sections, for example, such that there is no discontinuity at the transition from the first transmission line to the first coupled line sections. Accordingly, it is possible, for example, to mitigate unexpected attenuation caused by the discontinuity of transmission line.

In a preferred embodiment, the filter structure further comprises a further open stub. A length of the further open stub is the same as the length of the open stub, within a tolerance of +/−20 percent, or, preferably within a tolerance of +/−10 percent. Accordingly, it is possible to have a symmetrical filter structure, and therefore, the design effort and design costs are reduced.

In a preferred embodiment, an impedance of the further open stub is the same as the impedance of the open stub, within a tolerance of +/−20 percent, or, preferably within a tolerance of +/−10 percent. Accordingly, it is possible, for example, to improve accuracy of the open stub at the external part of the TECF which provides a transmission zero at $2f_0$. Hence, unwanted spurious pass-band in the region around $2f_0$ is effectively reduced.

In a preferred embodiment, the open stub is provided at a side of the first port, or, for example, at the first port, or at a position of the first port, or branching from the first transmission line or branching between the first port and the first coupled line section. Accordingly, it is possible to improve flexibility of filter structure design.

In a preferred embodiment, the further open stub is provided at a side of the second port, or, for example, or at the second port, or at a position of the second port, or branching from the first transmission line or branching between the second port and the last coupled line section. Accordingly, the filter can have a symmetrical structure and hence, it is possible to simplify the fabrication process.

In a preferred embodiment, the open stub comprises two stub portions. An impedance and an electrical length of each stub is the same, within a tolerance of +/−20 percent, or, preferably within a tolerance of +/−10 percent. The two stubs branch in opposite directions at the first port, e.g., stub portions are arranged symmetrically about centering the first portion. Accordingly, it is possible, for example, to reduce the length of the electrical filter, easily minimize the size of the electrical filter.

In a preferred embodiment, the further open stub comprises two stub portions. An impedance and an electrical length of each stub is the same, within a tolerance of +/−20 percent, or, for example, within a tolerance of +/−10 percent. The two stubs branch in opposite directions at the first port, e.g., stub portions are arranged symmetrically about centering the first portion. Accordingly, this arrangement is suitable for space saving.

In a preferred embodiment, the length of the one or more open stubs is chosen such that the one or more open stubs provide one or more transmission zero at the frequency of twice a passband center frequency, e.g., $2f_0$ of the filter, within a tolerance of +/−20 percent, or, preferably within a tolerance of +/−10 percent. Accordingly, it is possible, for example, to efficiently reduce the unwanted spurious pass-band in the region $2f_0$.

In a preferred embodiment, the filter is configured to have a passband around the passband center frequency, to have a local maximum of attenuation between the passband center frequency and the frequency of twice a passband center frequency, to provide attenuation of at least 10 dB or at least 15 dB of additional stop band attenuation at the frequency of twice a passband center frequency. That is, obtained attenuation is at least 10 to 15 db of additional atop band attenuation compared to the existing solution. Accordingly, this arrangement is possible to improve the electrical filter character.

An embodiment according to the invention creates another electrical filter structure for forwarding an electrical signal from a first port to a second port in a frequency selective manner. The filter is an edge-coupled filter, ECF, and the filter comprises a plurality of coupled line sections, CLS, coupled in a series, comprising at least a first coupled line section and a last coupled line section, optionally the filter comprises even more coupled line sections. The first port, P1, is connected with the first of the coupled line sections, e.g., with a first line section of the CLS at number 2 shown in FIG. 9 or 10, using a first transmission line. The second port, P2, is connected with the last of the coupled line sections, e.g. with a second line section of the CLS at number 3 shown in FIG. 9 or 10, using a second transmission line. The electrical filter comprises an open stub, e.g., at a side of the first port, or at the fist port, or at a position of the first port, or branching from the first transmission line or branching between the first port and the first coupled line section. A length of the open stub is chosen such that a frequency for which the open stub presents a short circuit at its end which is coupled to the electric filter structure lies, within a tolerance of +/−20 percent, between the passband center frequency of the filter and a frequency of twice the passband center frequency of the filter. Accordingly, it is, for example, possible to obtain transmission zero between $f_0$ and $2f_0$, and therefore, for example, the low-pass side of the filter becomes sharper, although at the expenses of the extension of the clean stop-band.

A preferred embodiment of the invention is a method for operation an electrical filter which forwards an electrical signal from a first port to a second port in a frequency selective manner. The filter is an edge-coupled filter, and a signal in a passband of the filter is forwarded through a plurality of coupled line sections, CLS, coupled in a series, comprising at least a first coupled line section which is connected to the first port and a last coupled line section, optionally even more coupled line sections, which is connected to the second port, with an attenuation which is smaller than 6 dB. A signal at a frequency of twice the passband center frequency is shorted using at least one open stub, such that the signal at the frequency of twice the passband center frequency is attenuated by at least 10 dB or by at least 15 dB. A length of the open stub is chosen such that an electrical length of the open stub is equal, within a tolerance of +/−20 percent, or, preferably within a tolerance of +/−10 percent, to a fourth of a wavelength of a signal having a frequency of twice a passband center frequency, e.g., $2f_0$ of the filter. Accordingly, by using this operation method, it is possible to obtain a demanded character of the filter.

A preferred embodiment of the invention, a method for designing an electrical filter forwarding a signal from a first port to a second port in a frequency selective manner. The filter is an edge-coupled filter, and the method comprises designing a plurality of coupled line sections, CLS, coupled in a series, comprising at least a first coupled line section and a last coupled line section [and optionally even more coupled line sections], such that the series of coupled line sections forwards a signal in a passband of the filter with an attenuation which is smaller than 6 dB. Choosing a length of an open stub such that an electrical length of the [first] open stub is equal, within a tolerance of +/−20 percent, or, preferably within a tolerance of +/−10 percent, to a fourth of a wavelength of a signal having a frequency of twice a passband center frequency, e.g., $2f_0$ of the filter. Choosing a length of a transmission line between the first port of the filter and a first of the coupled line sections and a width of the open stub, to have an impedance match, e.g., with a return loss of at least 10 dB, i.e., with a return loss not significantly worse than 10 dB, at the first port within the passband of the filter. Accordingly, by using this design method, it is possible, for example, to effectively provide an electrical filter having a demanded characteristic without having unwanted spurious pass-band.

BRIEF DESCRIPTION OF THE FIGURES

Embodiments according to the invention will subsequently be described taking reference to the enclosed figures in which:

FIG. 1(a) shows a schematic block diagram of an electrical filter structure according to embodiments of the present invention;

FIG. 2 (b) indicates an example of a microstrip layout according to embodiments of the present invention;

FIG. 2 (c) indicates an example of a microstrip layout according to embodiments of the present invention;

FIG. 4 shows a table comparing the response of the conventional electrical filter and the electrical filter according to the present invention;

FIG. 5 (b) illustrates a conventional electrical filter indicating a different variation of a stub;

FIG. 5 (c) indicates a microstrip layout according to the conventional electrical filter;

FIG. 5(d) indicates an example of a microstrip layout according to embodiments of the present invention;

FIG. 5(e) indicates an example of a microstrip layout according to embodiments of the present invention;

DETAILED DESCRIPTION OF THE EMBODIMENTS

Figure 1:
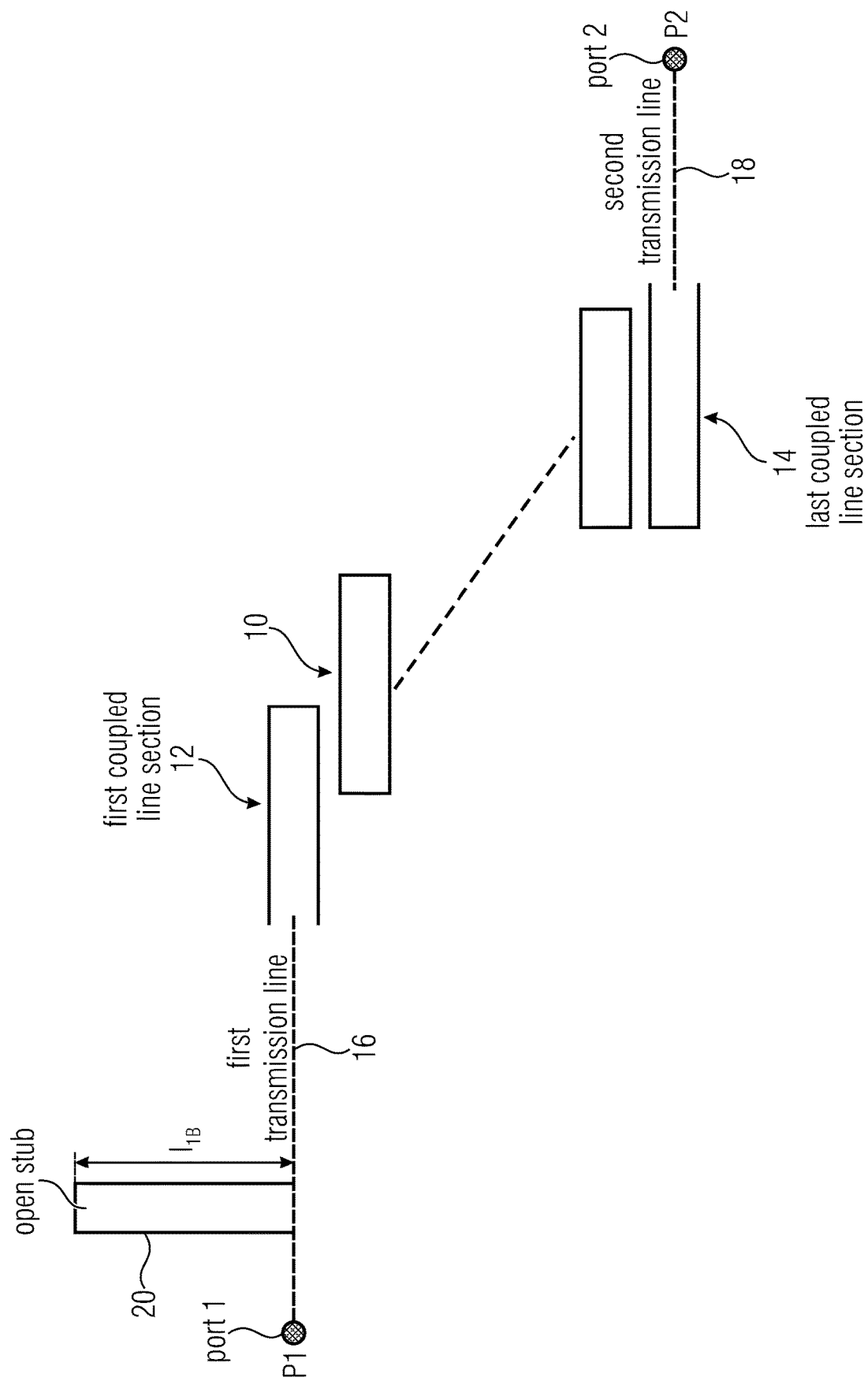
FIG. 1 (b) shows a schematic graph indicating a response of the electrical filter structure according to embodiments of the present invention.
Figure 1:
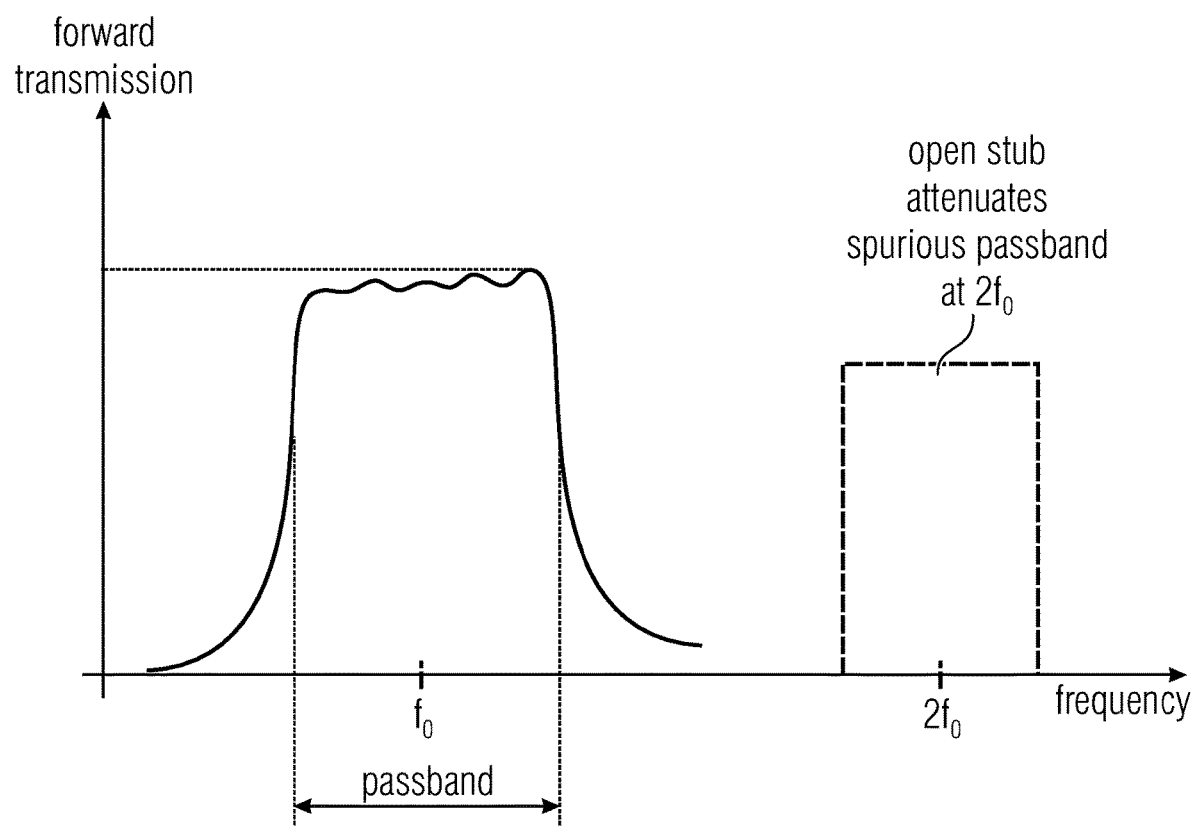

FIG. 1 (a) shows a schematic block diagram of an electrical filter structure according to the present invention. The electrical filter comprises a structure for forwarding an electrical signal from a first port P1 to a second port P2 in a frequency selective manner. The filter is a tapped edge-coupled filter TECF 10. The filter comprises a plurality of coupled line sections, CLSs, i.e., at least two coupled line sections, e.g., a first coupled line section 12, . . . and, a last coupled line section 14 in a series. The first port P1 is connected with the first of the coupled line sections using a first transmission line 16. The second port P2 is connected with the last CLS 14 using a second transmission line 18. The TECF 10 comprises an open stub 20 having a length $l_{1B}$ which is chosen such that an electrical length of the open stub is equal, within a tolerance of +/−20 percent, or, preferably within a tolerance of +/−10 percent, to a fourth of a wavelength of a signal, $\lambda/4$, having a frequency of twice a passband center frequency, $2f_0$, of the filter. The position of the open stub is not limited as shown in FIG. 1 (a), i.e., the open stub 20 may position at a side of the first port P1, or at the first port P1, or at a position of the first port P1, or branching from the first transmission line 16 or branching between the first port P1 and the first CLS 12.

FIG. 1 (b) shows a schematic graph indicating a response of the electrical filter structure according to the TECF 10 of FIG. 1(a). As indicated, an unwanted spurious pass-band in the region around $2f_0$ is effectively suppressed.

It is not shown in FIG. 1 (a), however, the TECF 10 may include further open stub, i.e., second open stub at a side of the second port P2, or at the second port P2, or at a position of the second port P2, or branching from the second transmission line 18 or branching between the second port P2 and the second CLS 14. In this case, an impedance $Z_{OB}$ of the open stub, i.e., a first open stub, and an impedance $Z_{OB}$ of the second stub are chosen such that a working impedance of the filter is matched e.g., in the pass band of the filter. A length $l_{1B}$ of the second stub is the same as the length of the first open stub within a tolerance of +/−20 percent, or, preferably within a tolerance of +/−10 percent. Also, the impedance $Z_{OB}$ of the second stub is the same as the impedance of the first open stub within a tolerance of +/−20 percent, or, preferably within a tolerance of +/−10 percent. In addition, the position of the open stub is not limited as depicted in FIG. 1, e.g., the first open stub may position at a side of the first port, or at the first port, or at a position of the first port, or branching from the first transmission line or branching between the first port and the first coupled line section. In the same manner, if the filter comprises a further open stub (second open stub), the second open stub may position at a side of the second port, or at the second port, or at a position of the second port, or branching from the second transmission line or branching between the second port and the second coupled line section.

Figure 2:
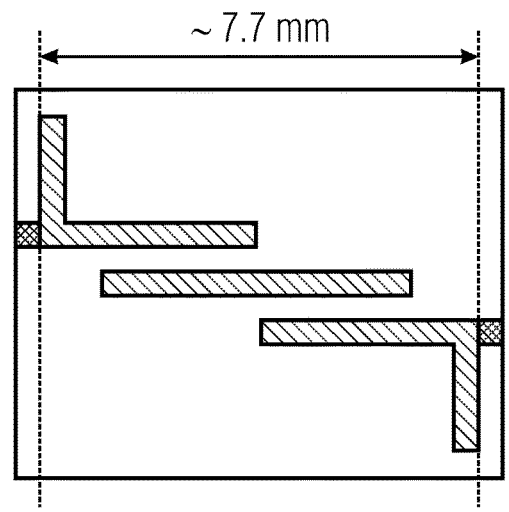
FIG. 2 (a) indicates a microstrip layout according to the conventional electrical filter.
Figure 2:
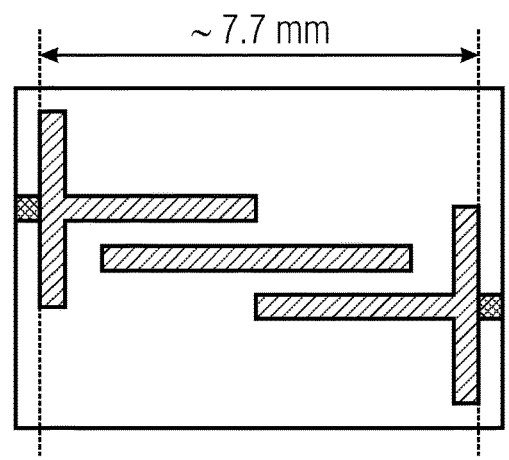
Figure 2:
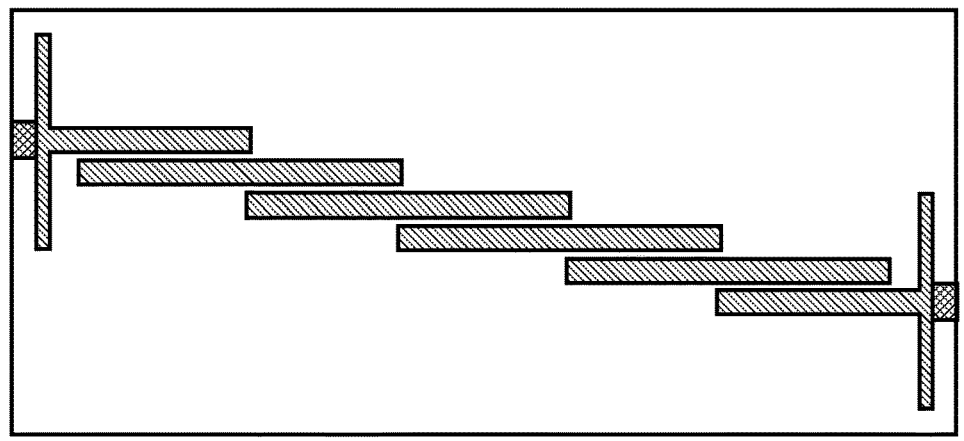
Figure 11:
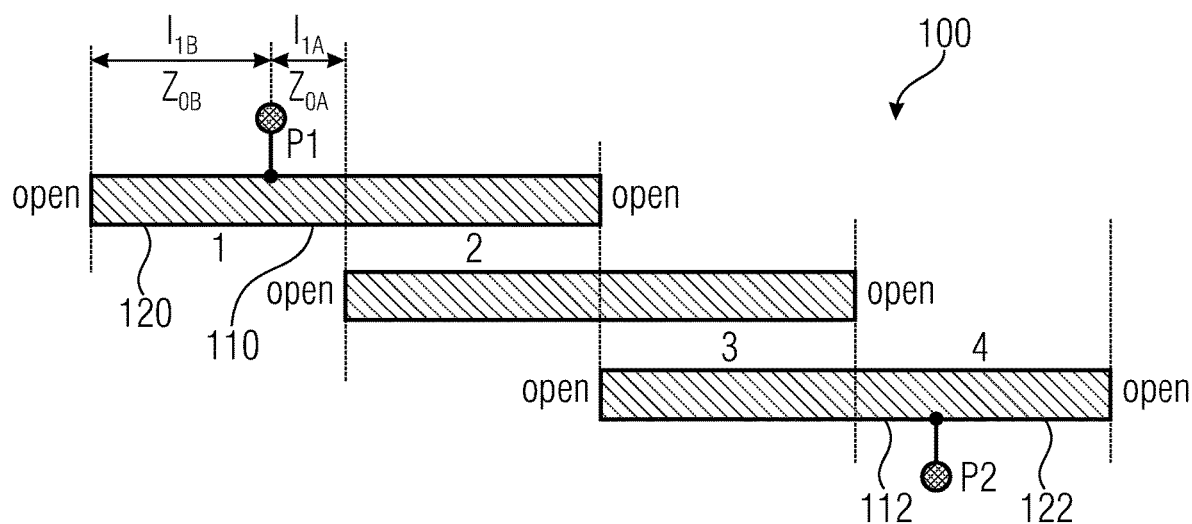
FIG. 11 shows a schematic illustration of a possible microstrip layout with the open stub in-line of conventional TECF.
Figure 12:
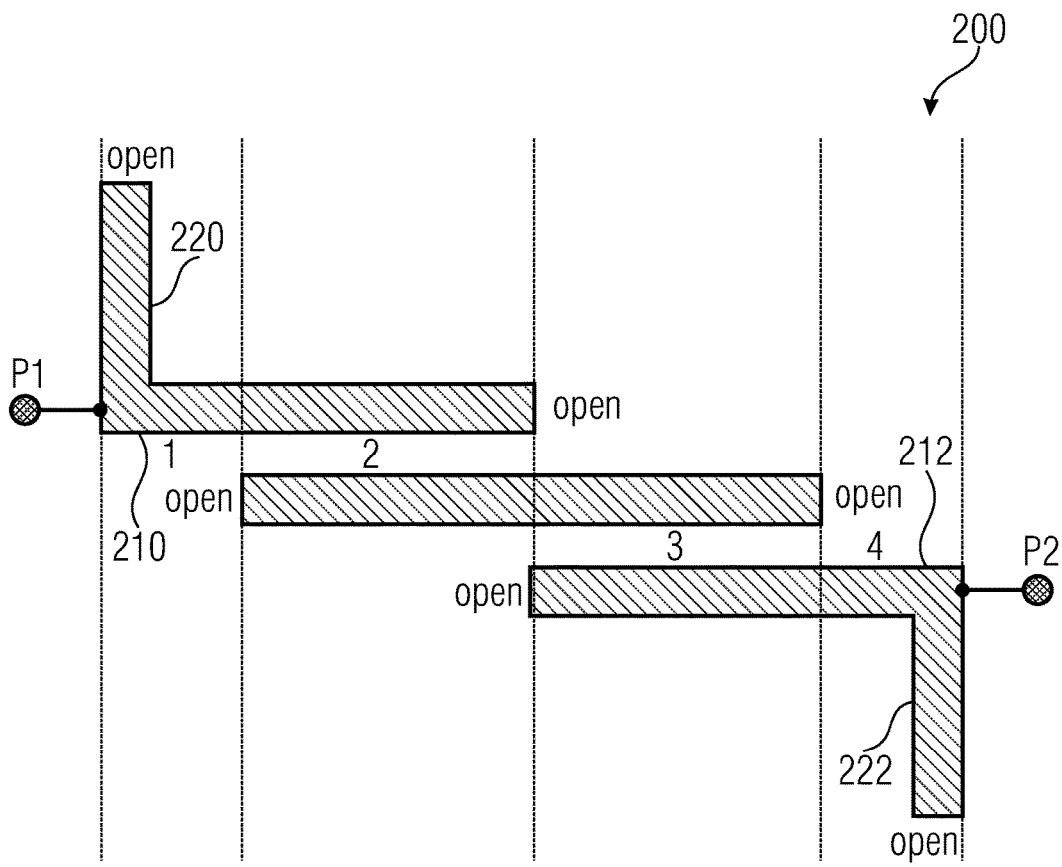
FIG. 12 shows another schematic illustration of a possible microstrip layout with the open stub rotated by 90 degree of conventional TECF.
Figure 13:
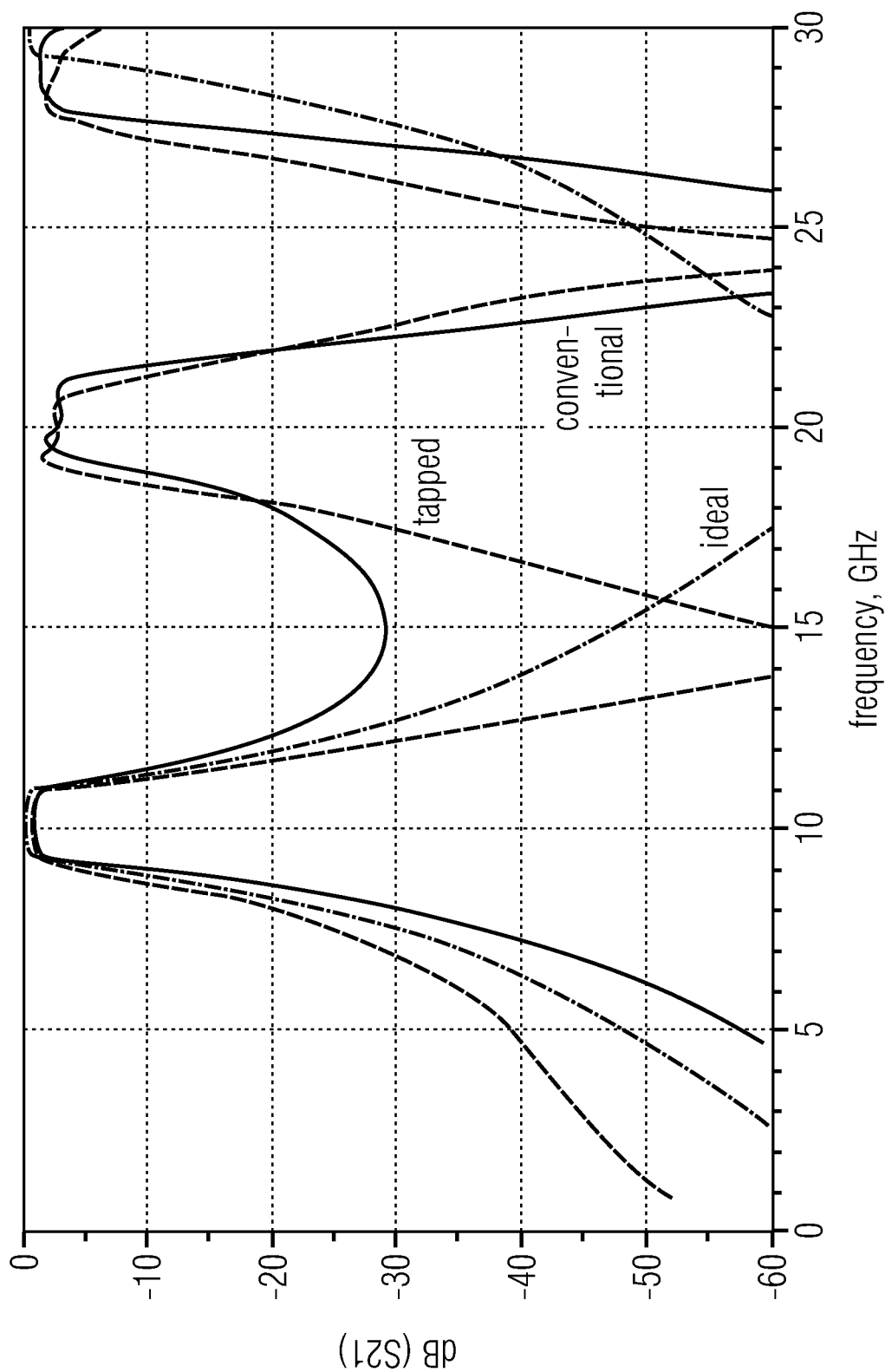
FIG. 13 shows examples of edge-coupled filter response, according to conventional ECFs.
Figure 14:
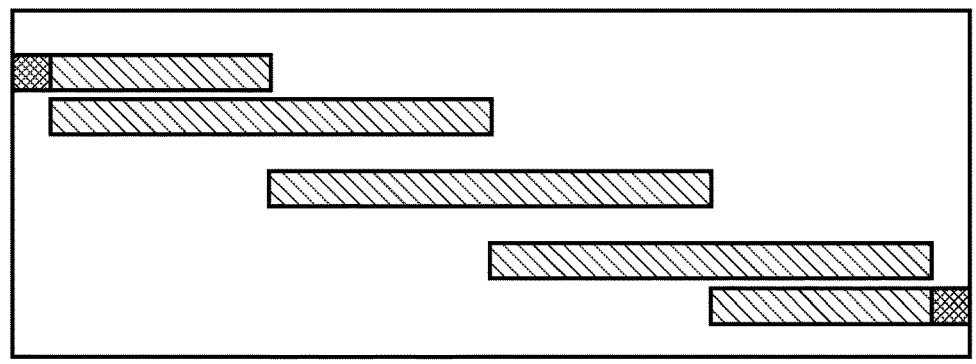
FIGS. 14 (a), 14 (b) and 14 (c) illustrate exemplary illustrations of microstrip layout variations of conventional ECF and TECFs.
Figure 14:
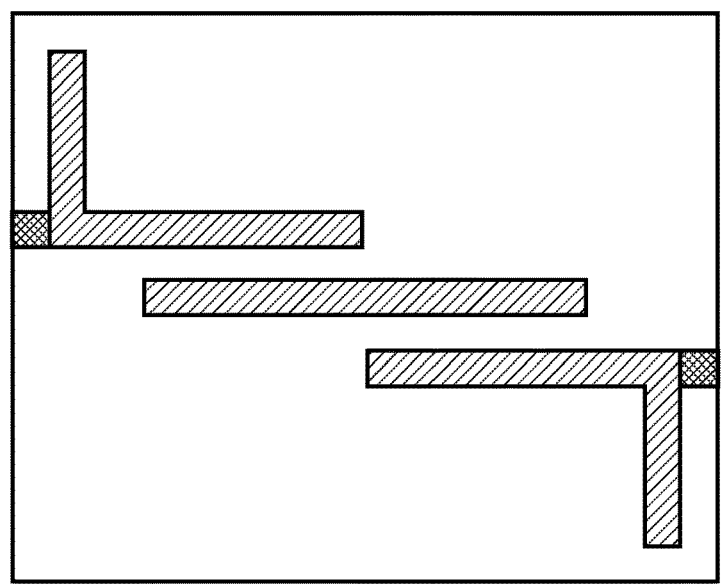
Figure 14:
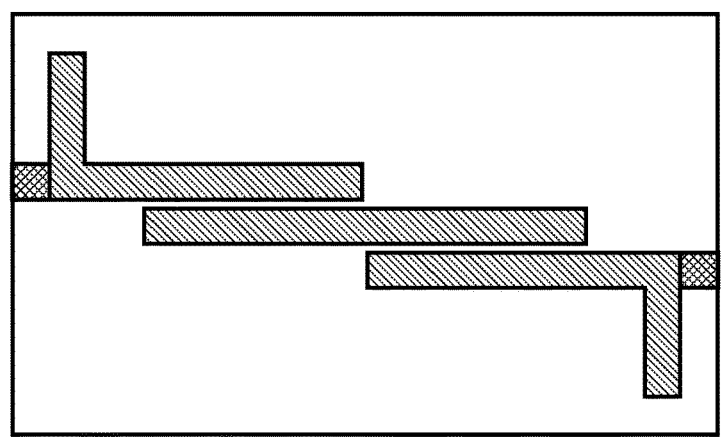
Figure 15:
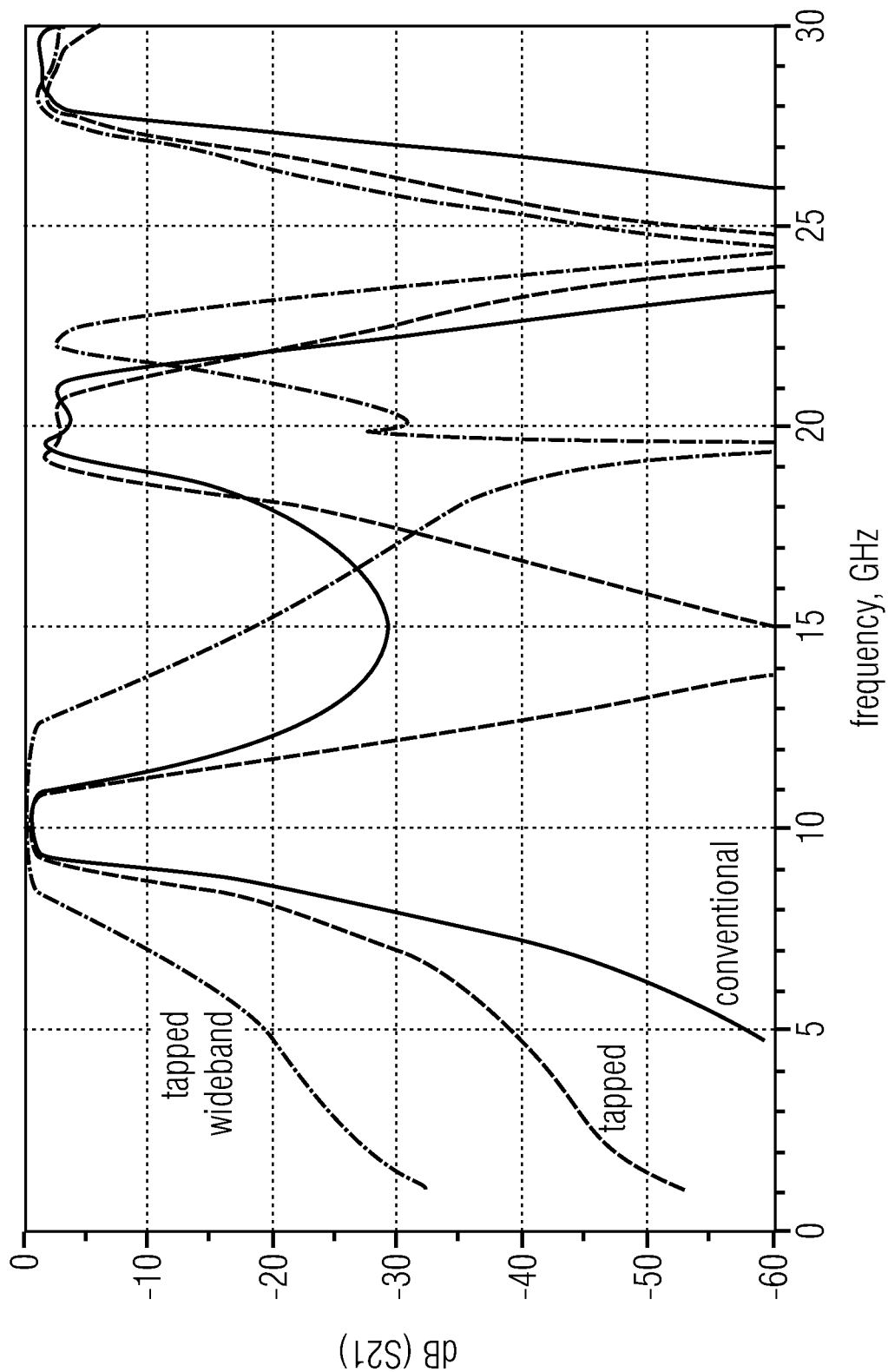
FIG. 15 shows examples of response of conventional ECF and TECFs indicated in FIG. 14.

FIG. 2 (a) indicates a microstrip layout according to the conventional electrical filter, TECF, as also indicated in FIG. 11 or FIG. 14 (b). FIGS. 2 (b) and (c) indicate examples of a microstrip layout according to the present invention. The parameters of the filters are set as below:

FIG. 2 (a) $f_0$=10 GHz, $\Delta f/f_0 \approx 0.15$. Microstrip with $\varepsilon_r$=9.9, h=508 μm.

FIG. 2 (b) ~same $f_0$, $\Delta f$, and microstrip substrate as FIG. 2 (a).

FIG. 2 (c) $f_0$=24 GHz, $\Delta f/f_0 \approx 0.28$.

As indicated in FIGS. 2 (b) and (c), the first open stub comprises two stub portions and the stub portions branch in opposite directions at the first port, and also the second stub portion comprises two stub portions and the stub portions branch in opposite directions at the second port. That is, if an impedance of the open stub becomes too low, single open stub at end of the filter, could be replaced by two stubs. Therefore, as indicated in FIG. 2, two stub portions are branched. In addition, an impedance and an electrical length of each stub portions of the first open stub is the same, with in a tolerance of +/−20 percent, or, preferably within a tolerance of +/−10 percent. The same apply to the stub portions of the second open stub.

FIG. 2 (c) shows a variation of TECF in accordance with the present invention. As depicted in FIG. 2 (c), a width of the stub portion may vary. In addition, a gap between the CLSs may also vary. In case the gap between the CLSs is tight, e.g., as indicated in FIG. 2 (c) which depicts that the gap between the CLSs is tighter than the gap between the CLSs of FIG. 2 (b), an unwanted spurious pass-band in the region around $2f_0$ is further mitigated as shown in FIG. 3.

Figure 3:
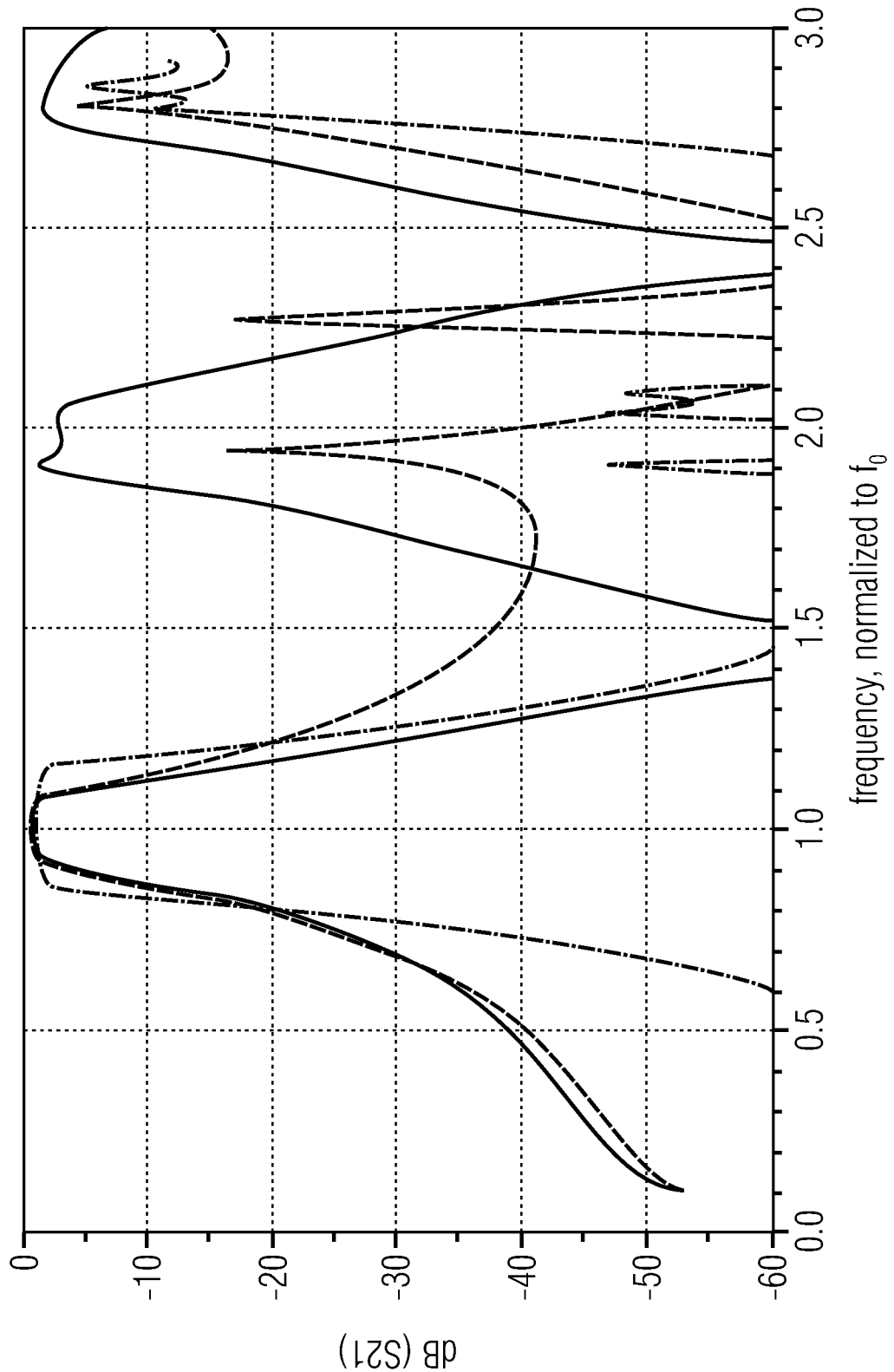
FIG. 3 shows examples of edge-coupled filter response, according to the conventional filter and the embodiments of the present invention.

FIG. 3 shows examples of edge-coupled filter response, according to the filters indicated in FIG. 2, i.e., a line indicates a response of filter shown in FIG. 2 (a), a dashed line indicates a response of filter shown in FIG. 2 (b) and a double-dashed line indicates a response of filter shown in FIG. 2 (c). As shown FIG. 3, the TECF indicated in FIG. 2 (b) shows better mitigation of unwanted spurious pass/band in the region around $2f_0$ than the TECF of FIG. 2 (a) and the TECF indicated in FIG. 2 (c) shows the most mitigation of unwanted spurious pass-band in the region around $2f_0$.

Figure 9:
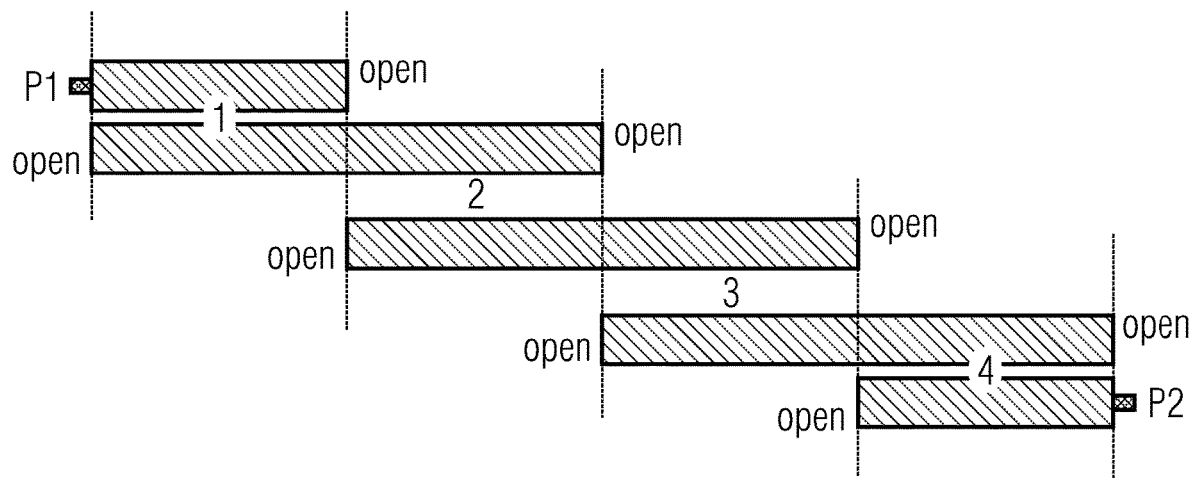
FIG. 9 shows a schematic illustration of an example of a layout of a possible printed-circuit realization of conventional ECF.
Figure 10:
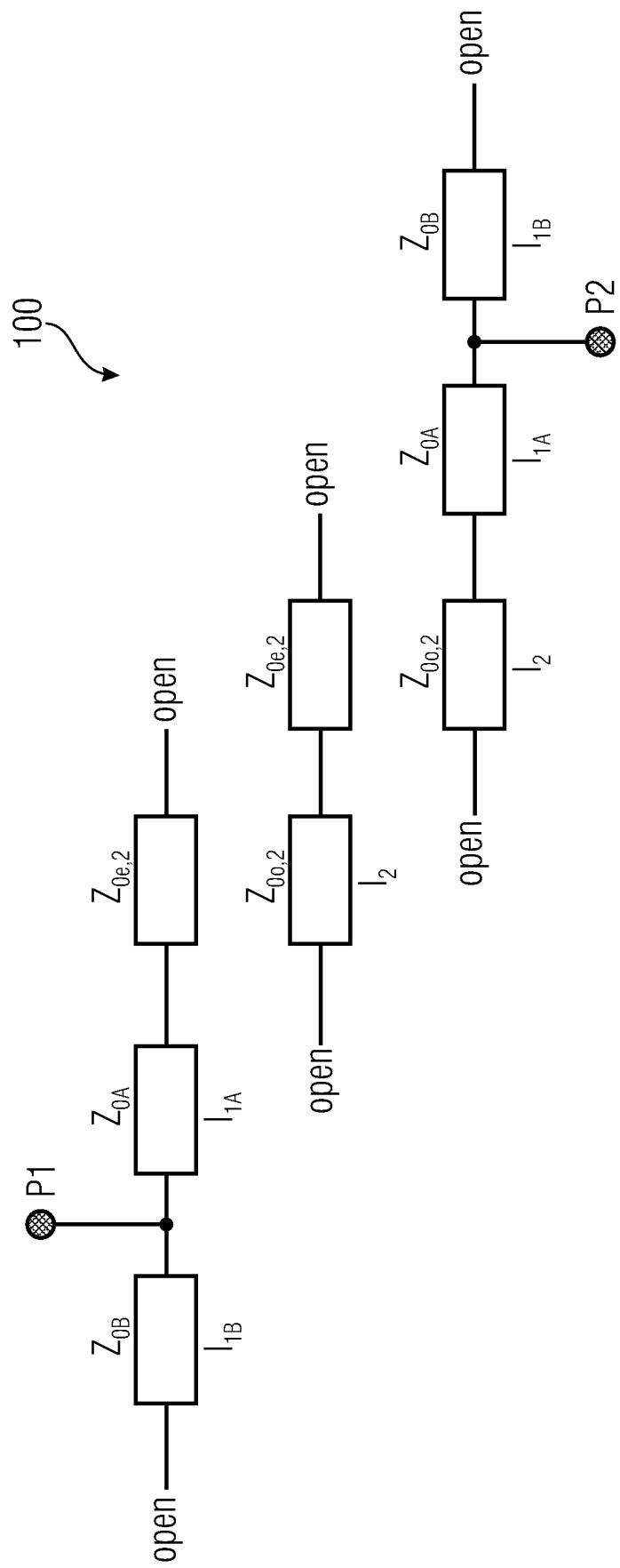
FIG. 10 shows a schematic electrical principle diagram of an example of conventional tapped-edge-coupled filter (TECF)

FIG. 4 shows a table indicating comparison of the response of the conventional electrical filter and the electrical filter according to the present invention. "Conventional" indicates the result of the known ECF (conventional ECF), "Tapped (old)" indicates a result of the known TECF, and the "Tapped (new)" indicates a result of the TECF according to the present invention. As shown in FIG. 4, TECF according to the present invention (TECG (new) in FIG. 4), e.g., electrical filters depicted in FIGS. 2 (b) and (c), shows clearly better result than the conventional ECF (conventional in FIG. 4), e.g., shown in FIG. 9 and TECF (Tapped (old) in FIG. 4), e.g., shown in FIGS. 2 (a), 9 and 10. Especially, result of the minimum stop-band attenuation for $f<2f_0$ is clearly better than the conventional ECF and TECF. The table shown in FIG. 4 is based on the examples disclosed in this description, and therefore, the numbers in the table are only indicative.

Figure 5:
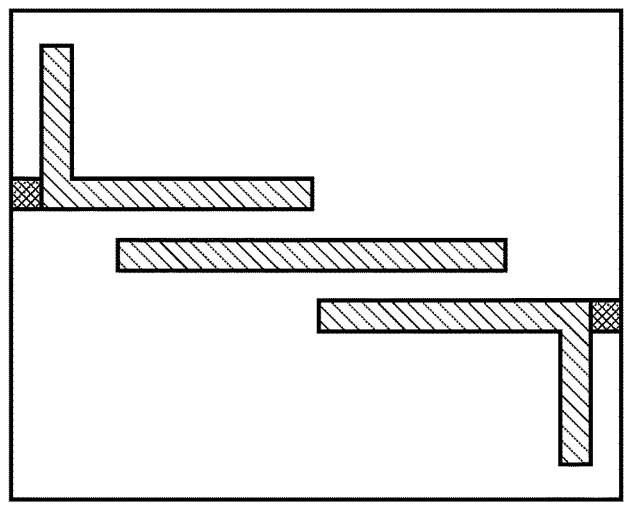
FIG. 5 (a) indicates a microstrip layout according to the conventional electrical filter.
Figure 5:
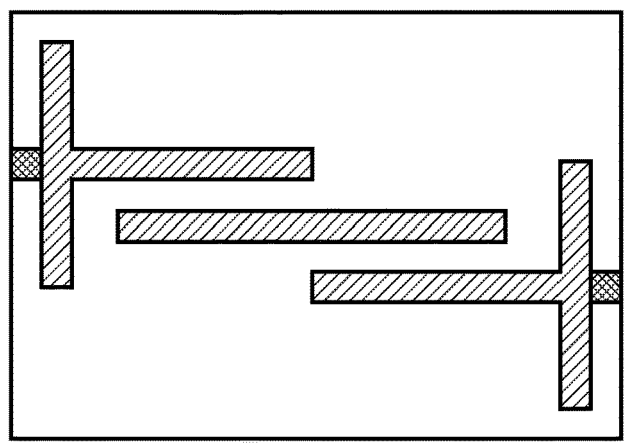
Figure 5:
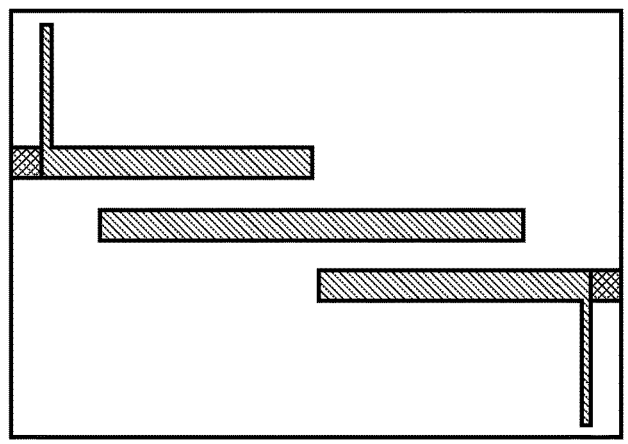

FIGS. 5 (a) and (c) indicates a microstrip layout according to the conventional electrical filter, TECF, as also indicated in FIGS. 14 (a) and (b). The TECF of FIG. 5 (b) is also conventional electrical filter indicating different variation of stub. FIG. 5 (d) indicates a microstrip layout of the present invention, as also indicated in FIG. 2 (b), and FIG. 5 (e) indicates another example of a microstrip layout according to the present invention. As shown in FIG. 5 (e), the electrical filter of another example according to the present invention has stubs which are longer and narrower compare to the electrical filter shown in FIGS. 5 (c) and (d). That is, the stubs are narrower in order to have higher characteristic impedance and keep the in/band impedance matching of the filter.

Figure 6:
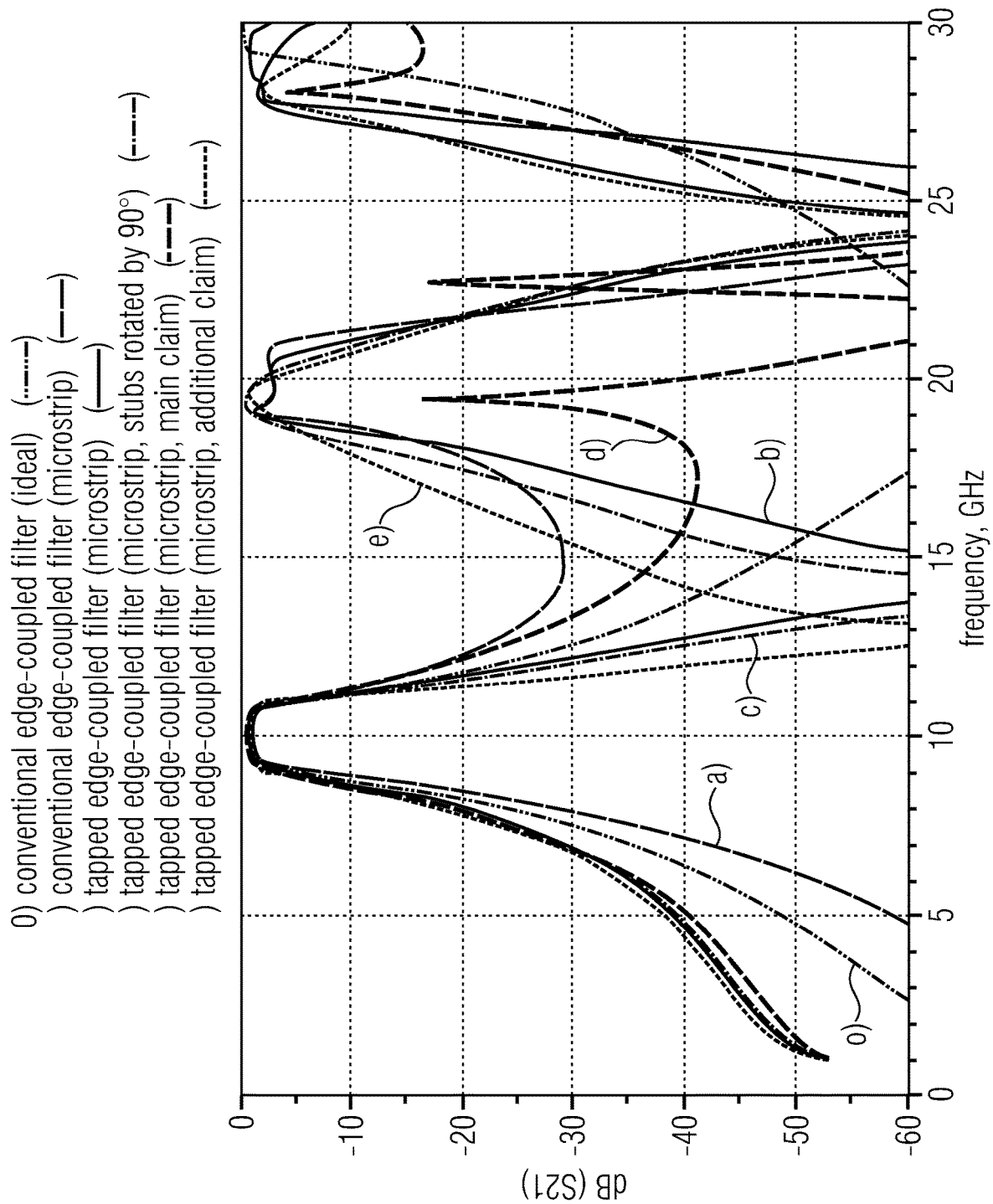
FIG. 6 shows examples of edge-coupled filter response, according to the filters shown in FIG. 5.

FIG. 6 shows examples of edge-coupled filter response, according to the filters indicated in FIG. 5, i.e., a long dashed line 0) in FIG. 6 indicates a response of an ideal case (not shown in FIG. 5), a line a) in FIG. 6 indicates a response of a conventional microstrip edge-coupled filter shown in FIG. 5 (a), one dot chain-line b) in FIG. 6 indicates a response of a tapped edge-coupled microstrip filter shown in FIG. 5 (b), a dashed line c) in FIG. 6 indicates a response of a tapped edge-coupled microstrip filter (stubs are rotated by 90 degree) shown in FIG. 5 (c), a bold long dashed line d) in FIG. 6 indicates a response of a tapped edge-coupled microstrip filter according to the present invention, i.e., shown in FIG. 5 (d) as well as shown in FIG. 2 (b) and a double-dot chain-line e) in FIG. 6 indicates a response of tapped edge-coupled microstrip filter according to another example of the present invention shown in FIG. 5 (e).

The TECF in accordance with the present invention is operated in the manner as follows:

A signal in a passband of the filter is forwarded through a plurality of coupled line sections, CLSs, coupled in a series, comprising at least a first coupled line section which is connected to the first port and a last coupled line section, optionally even more coupled line sections, which is connected to the second port, with an attenuation which is smaller than 6 dB; and a signal at a frequency of twice the passband center frequency is shorted using at least one open stub, such that the signal at the frequency of twice the passband center frequency is attenuated by at least 10 dB or by at least 15 dB. In addition, as already explained above, a length $l_{1B}$ of the first open stub, optionally also the second open stub, is chosen such that an electrical length of the first (and second) open stub is equal, within a tolerance of +/−20 percent, or, preferably within a tolerance of +/−10 percent, to a fourth of a wavelength of a signal having a frequency of twice a passband center frequency of the filter. Furthermore, a length $l_{1B}$ of the first open stub, optionally also the second open stub, is chosen such that an electrical length of the first (and second) open stub falls, within a tolerance of +/−20 percent, or, preferably within a tolerance of +/−10 percent, between the passband center frequency of the filter and a frequency of twice the passband center frequency of the filter.

The electrical filter of the present invention is designed by using a method as disclosed below.

Figure 7:
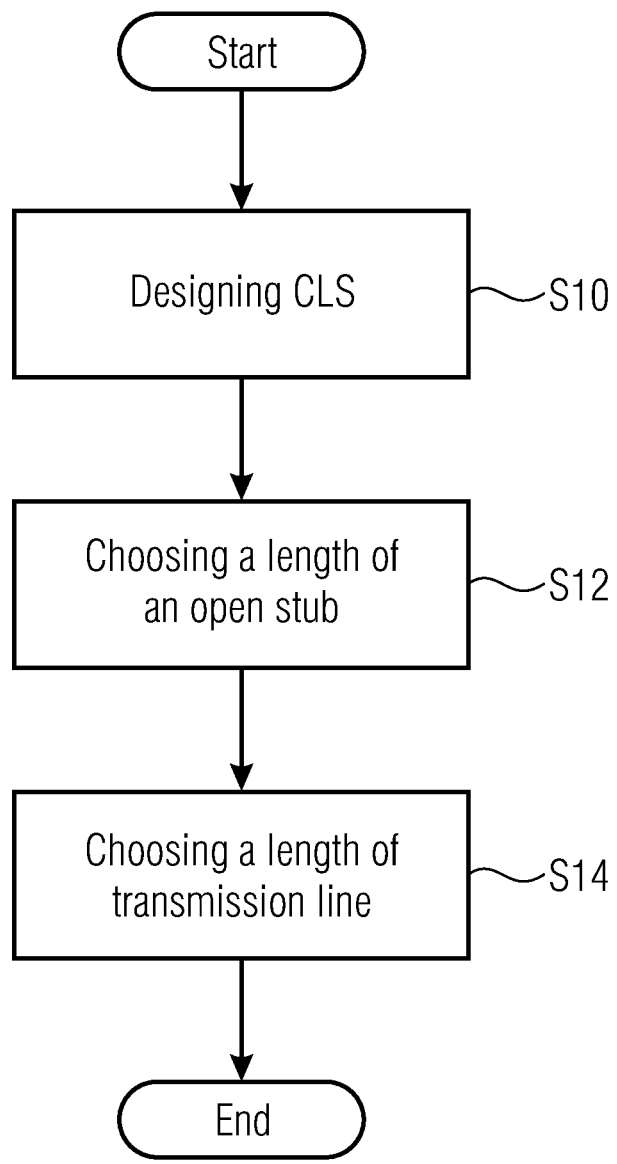
FIG. 7 shows a flowchart of a method for designing an electrical filter, in accordance with the present invention.
Figure 8:
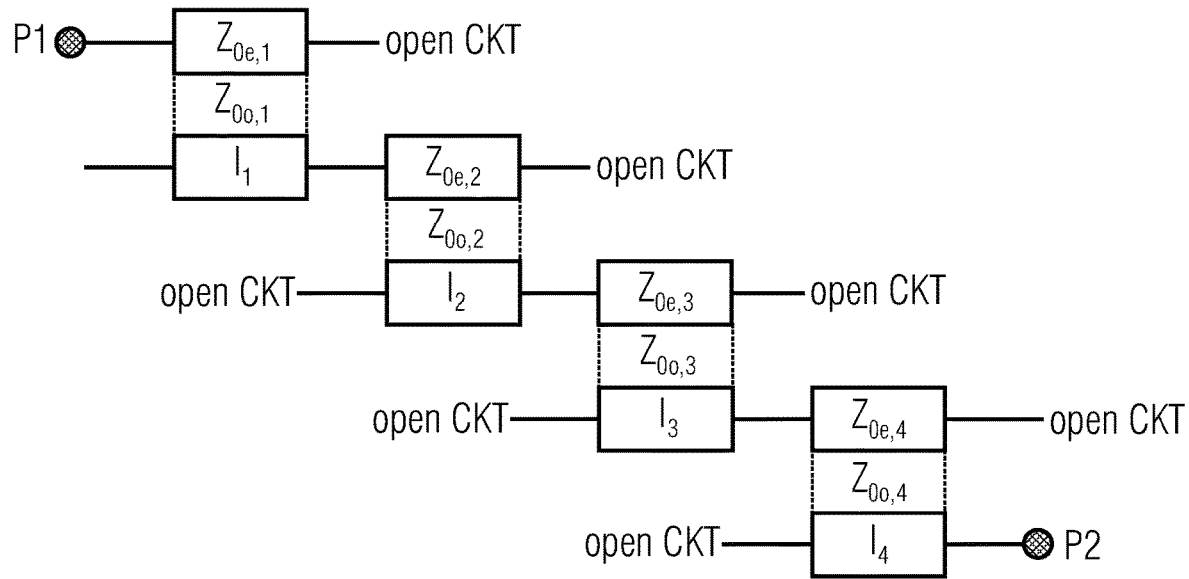
FIG. 8 shows a schematic electric principle diagram of an example of conventional edge-coupled filter (ECF)

As shown in FIG. 7, a plurality of CLSs which are coupled in a series is designed (S10). That is, CLSs are designed to comprise at least a first coupled line section and a last coupled line section, such that the series of coupled line sections forwards a signal in a passband of the filter with an attenuation which is smaller than 6 dB. The number of the CLSs may be varied in accordance with any demand/requirements/necessity.

In the next step, a length of an open stub is chosen (S12). That is, the length of the open stub such that an electrical length of the open stub is equal, within a tolerance of +/−20 percent, or, within a tolerance of +/−10 percent, to a fourth of a wavelength of a signal having a frequency of twice a passband center frequency of the filter. In case, further open stub is required, a length of further open stub is chosen in the same manner.

Then, a length of a transmission line is chosen (S14). That is, the length of the transmission line between the first port of the filter and a first of the coupled line sections and a width of the open stub is chosen to have an impedance match, e.g., with a return loss not significantly worse than 10 dB at the first port within the passband of the filter.

As disclosed above, it is possible to mitigate unwanted spurious pass-band in the region around $2f_0$ according to the electrical filter structure of the present invention by choosing the length of the open stub (electrical length of the open stub) is equal, within a tolerance of +/−20 percent, to a fourth of a wavelength of a signal having a frequency of twice a passband center frequency of the filter.

In addition, the impedance of the open stub is chosen such that a working impedance of the filter is matched. Hence, the open stub at the external part of the TECF provides a transmission zero at $2f_0$, and therefore, the quality of the electrical filter is appropriately improved.

It should be noted that the above described filter structure can be varied over a wide range. For example, embodiments according to the invention are not limited to band-pass filter structure. Rather, it is possible to implement low-pass filter structure or high-pass filter structure. In addition, the numbers of CLS and a gap between CLS may be varied dependent on required quality of the filter.

The invention claimed is:

1. An electrical filter comprising:
   a plurality of coupled line sections coupled in series, comprising at least a first coupled line section and a last coupled line section;
   a first port and a second port, wherein an electrical signal is forwarded from the first port to the second port in a frequency selective manner,
   wherein the first port is connected with the first coupled line section using a first transmission line, and
   wherein the second port is connected with the last coupled line section using a second transmission line; and
   an open stub,
   wherein the open stub comprises a length wherein an electrical length of the open stub is equal, within a tolerance of +/−20 percent, to a fourth of a wavelength of a signal having a frequency of twice a passband center frequency of the electrical filter, wherein the electrical filter is an edge-coupled filter.

2. The electrical filter according to claim 1, wherein an impedance of the open stub matches a working impedance of the electrical filter.

3. The electrical filter according to claim 1, wherein a length of the first transmission line matches a working impedance of the electrical filter.

4. The electrical filter according to claim 1, wherein a width of the first transmission line is a same width of the first coupled line section.

5. The electrical filter according to claim 1, further comprising another open stub,
   wherein a length of the another open stub is the same as the length of the open stub, within a tolerance of +/−20 percent.

6. The electrical filter according to claim 5, wherein an impedance of the another open stub is equivalent to the impedance of the open stub, within a tolerance of +/−20 percent.

7. The electrical filter according to claim 5, wherein the further open stub is disposed at a side of the second port.

8. The electrical filter according to claim 5, wherein the another open stub comprises two stub portions, and
   wherein an impedance of and an electrical length of each stub portion of the another open stub is the same, within a tolerance of +/−20 percent, and
   wherein the two stub portions of the another open stub branch in opposite directions at the first port.

9. The electrical filter according to claim 5, wherein the lengths of the open stub and the another open stub are selected wherein the open stub and the another open stub provide one or more transmission zero at the frequency of twice a passband center frequency of the electrical filter, within a tolerance of +/−20 percent.

10. The electrical filter according to claim 1, wherein the open stub is disposed at a side of the first port.

11. The electrical filter according to claim 1, wherein the open stub comprises two stub portions, and
    wherein an impedance of and an electrical length of each stub portion is the same, within a tolerance of +/−20 percent, and
    wherein further the two stub portions branch in opposite directions at the first port.

12. The electrical filter according to claim 1, characterized to have a passband around the passband center frequency, to have a local maximum of attenuation between the passband center frequency and the frequency of twice a passband center frequency, and to provide attenuation of at least 10 dB.

13. The electrical filter according to claim 12, characterized to provide attenuation of at least 15 dB of additional stop-band attenuation at the frequency of twice a passband center frequency.

14. An electrical filter comprising:
- a plurality of coupled line sections coupled in series, comprising at least a first coupled line section and a last coupled line section;
- a first port and a second port, wherein the first port is operable to forward an electrical signal to the second port in a frequency selective manner,
- wherein the first port is coupled with the first of the coupled line section using a first transmission line, and
- wherein the second port is coupled with the last coupled line section using a second transmission line; and
- an open stub,
- wherein the open stub comprises a length wherein a frequency for which the open stub presents a short circuit at its end lies, within a tolerance of +/−20 percent, between a passband center frequency of the electrical filter and a frequency of twice the passband center frequency of the electrical filter.

15. A method of operating an electrical filter the method comprising:
- forwarding a signal in a passband of the electrical filter through a plurality of coupled line sections, wherein the plurality of line sections are coupled in series, and wherein the plurality of coupled line sections comprise at least a first coupled line section which is connected to a first port and a last coupled line section which is connected to a second port, wherein the forwarding comprises forwarding the signal from the first port to the second port in a frequency selective manner; and
- shorting a signal at a frequency of twice a passband center frequency using at least one open stub, wherein the signal at the frequency of twice the passband center frequency is attenuated by at least 10 dB, and
- wherein further the open stub comprises a length wherein an electrical length of the open stub is equal, within a tolerance of +/−20 percent, to a fourth of a wavelength of a signal having a frequency of twice a passband center frequency of the electrical filter.

16. The method of claim 15, wherein an impedance of the open stub matches a working impedance of the electrical filter.

17. The method of claim 15, wherein the electrical filter is an edge coupled filter.

18. A method for designing an electrical filter the method comprising:
- coupling a plurality of coupled line sections together in series fashion wherein the plurality of coupled line sections comprises at least a first coupled line section and a last coupled line section;
- forwarding a signal through the plurality of coupled line sections coupled in series in a passband of the electrical filter with an attenuation which is smaller than 6 dB;
- selecting a length of an open stub wherein an electrical length of the open stub is equal, within a tolerance of +/−20 percent, to a fourth of a wavelength of a signal having a frequency of twice a passband center frequency of the electrical filter; and
- selecting a length of a transmission line between a first port of the electrical filter and a first of the plurality of coupled line sections and a width of the open stub to have an impedance match at the first port within the passband of the electrical filter, wherein the forwarding comprises forwarding the signal from the first port to a second port in a frequency selective manner.

19. The method of claim 18, wherein the electrical filter is an edge coupled filter.

20. The method of claim 18, further comprising:
- selecting a length of another open stub, as the same length of the open stub, within a tolerance of +/−20 percent.

* * * * *